(12) United States Patent
Kawamura et al.

(10) Patent No.: US 7,662,543 B2
(45) Date of Patent: *Feb. 16, 2010

(54) PATTERN FORMING METHOD AND METHOD OF MANUFACTURING SEMICONDUCTOR DEVICE

(75) Inventors: Daisuke Kawamura, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 613 days.

This patent is subject to a terminal disclaimer.

(21) Appl. No.: 11/350,080

(22) Filed: Feb. 9, 2006

(65) Prior Publication Data

US 2006/0177777 A1    Aug. 10, 2006

(30) Foreign Application Priority Data

Feb. 10, 2005   (JP) .............................. 2005-034540

(51) Int. Cl.
   *G03F 7/26*   (2006.01)
(52) U.S. Cl. ...................................... 430/311; 430/961
(58) Field of Classification Search ................ 430/311, 430/30, 961
   See application file for complete search history.

(56) References Cited

U.S. PATENT DOCUMENTS

2005/0030511 A1   2/2005  Auer-Jongepier et al.

FOREIGN PATENT DOCUMENTS

WO    WO-99/49504    9/1999

OTHER PUBLICATIONS

Kawamura et al.; "Influence of the Watermark in Immersion Lithography Process"; Advances in Resist Technology and Processing XXII, Proceedings of SPIE, vol. 5753, pp. 818-826, (2005).

*Primary Examiner*—Kathleen Duda
(74) *Attorney, Agent, or Firm*—Finnegan, Henderson, Farabow, Garrett & Dunner, L.L.P.

(57) ABSTRACT

A pattern forming method includes forming a resist film on a substrate, coating the resist film with a coating solution which forms a cover film on the resist film to form the cover film on the resist film, transferring a pattern onto the resist film by an immersion lithography method using a liquid immersion fluid to form a latent image on the resist film, removing the cover film after the formation of the latent image, conducting a first inspection to inspect whether or not the cover film has a defect between said forming the latent image and said removing the cover film, performing predetermined processing when the defect is found in the first inspection, and developing the resist film to form a resist pattern on the substrate after said removing the cover film.

6 Claims, 13 Drawing Sheets

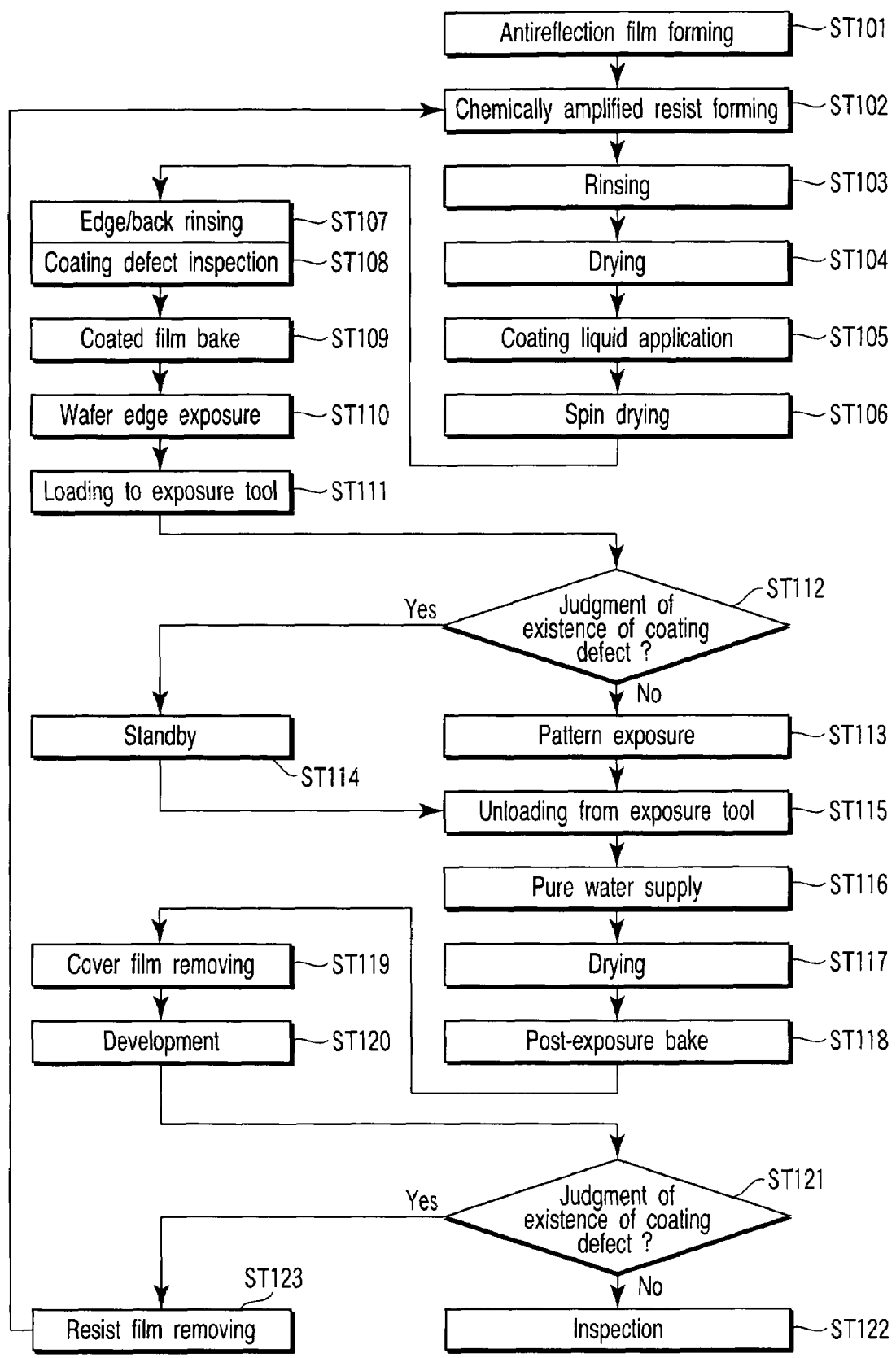
F I G. 1

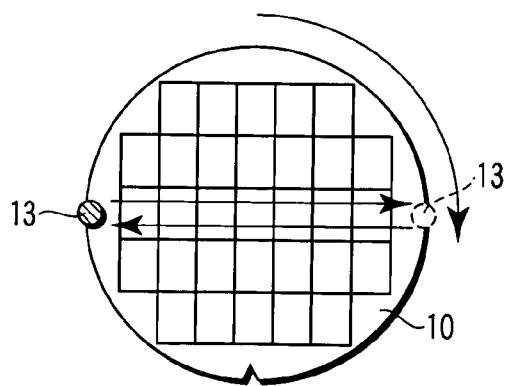
F I G. 2A
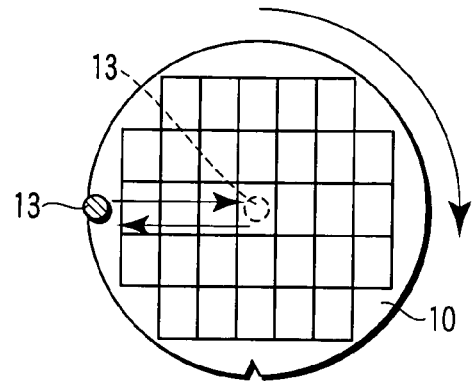
F I G. 3A
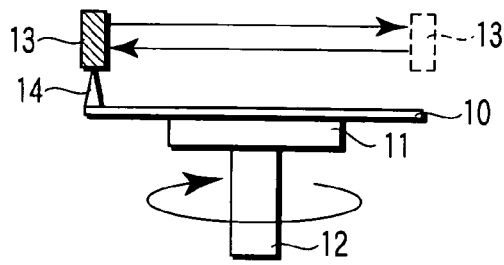
F I G. 2B
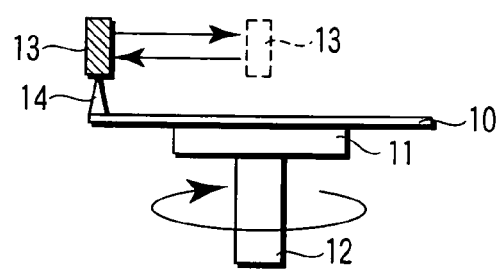
F I G. 3B
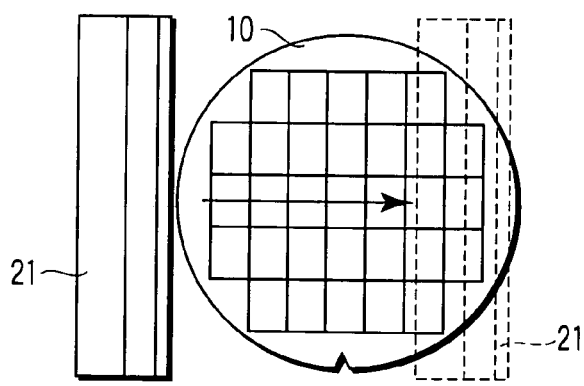
F I G. 4A
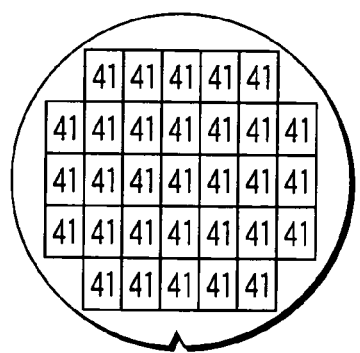
F I G. 6
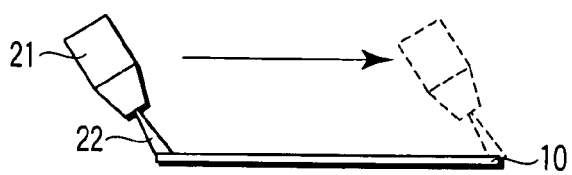
F I G. 4B

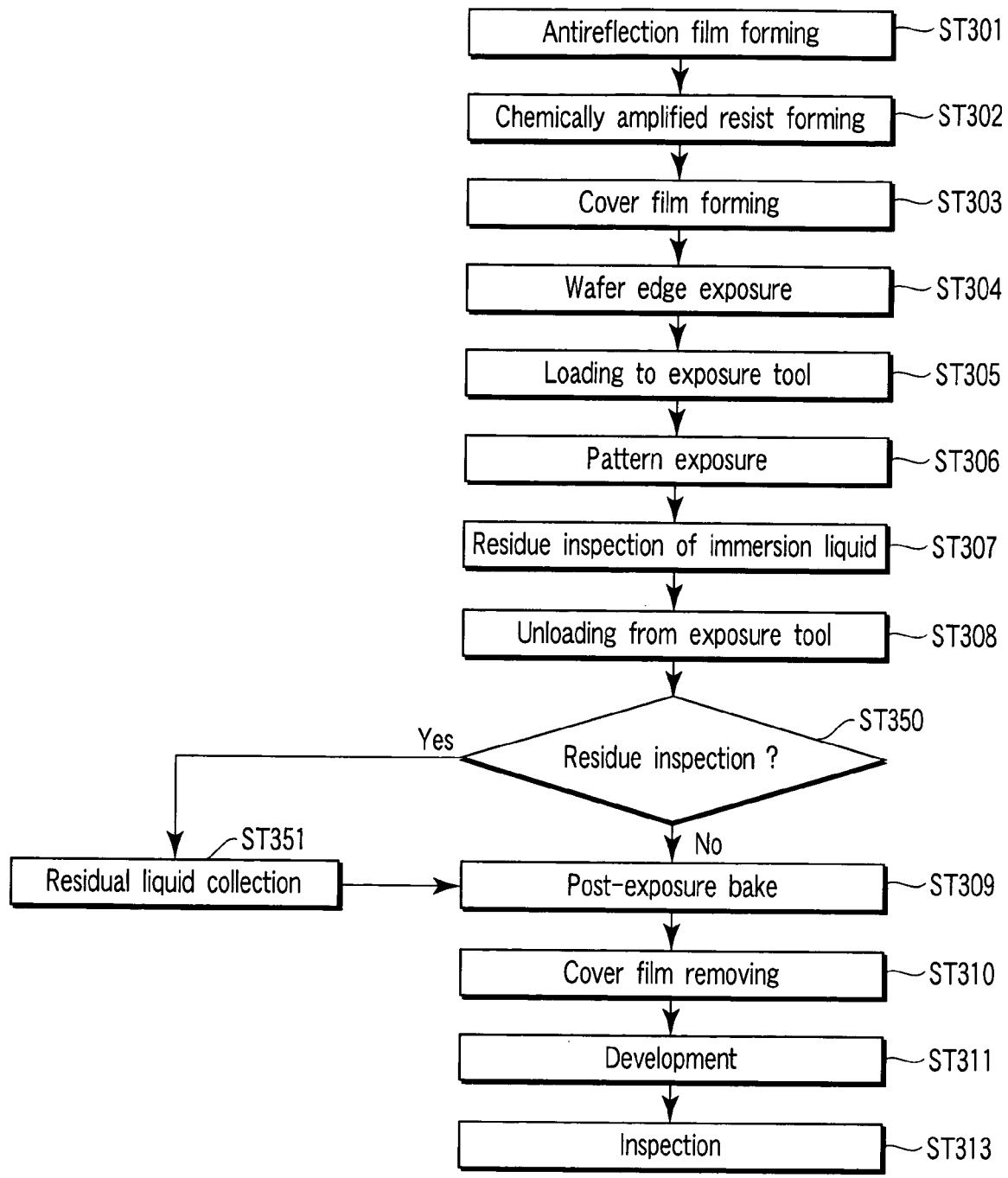
F I G. 20

PATTERN FORMING METHOD AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-034540, filed Feb. 10, 2005, the entire contents of which are incorporated herein by reference.

BACKGROUND OF THE INVENTION

1. Field of the Invention

The present invention relates to a pattern forming method based on immersion lithography, and a method of manufacturing a semiconductor device.

2. Description of the Related Art

Development of exposure tools has been in progress along with shrinkage of semiconductor devices. A 157 nm-lithography tool has been developed as a next-generation lithography tool, which replaces a tool presently in practical use to 193 nm lithography. However, due to delays in development of exposure tools and resist materials, a 193 nm-immersion lithography exposure tool is regarded as reliable at present. In the immersion lithography exposure tool, a solvent such as water which is a medium having a refractive index greater than that of air is filled between an objective lens and resist films targeted for image formation to increase a critical angle of an interface between the objective lens and the medium or an interface between the medium and the resist films, and an appropriate lens is used to enable image formation of a small pattern with a larger diffraction angle (refer to pamphlet for International publication No. WO99/49504).

In an optical lithography step where the immersion lithography exposure tool is used to transfer a pattern to a resist film, there is concern over the elution of an inclusion from the resist film into a liquid immersion fluid. This arises from the fear that a photo-acid generator contained in the resist film and its photoproducts which are photo-generated acids, basic materials and other low-molecular components elute into the immersion fluid and contaminate the element of the projection optics which contacts with the liquid immersion fluid, a shower head, a wafer stage, and so forth. The adsorption of the eluting substances onto the projection optics or corrosion thereof emerges as an optical path difference, and therefore influences imaging performance as aberration and flare, and it is presumed that this influence accumulatively increases due to an increase in processing for the resist processes of the same kind. On the other hand, the elusion of the substance into the immersion fluid changes the refractive index of the immersion fluid and thus changes the optical path length, which causes aberration of a projected image and affects the imaging performance.

Furthermore, in an immersion lithography exposure tool which selectively fills the liquid immersion fluid between a downstream surface of an optical axis of the objective lens and a substrate upper surface targeted for image projection, the following problems occur in a case where the liquid immersion fluid remains on the substrate when the substrate is loaded after completion of an exposure step.

1. If the liquid immersion fluid leaks into the exposure tool and a coating tool and touches electric systems therein, trouble occurs in the operation of the tools. This results in a reduction in productivity and generation of costs due to the stoppage and repair of the tools, and a loss due to the reprocessing and damage of a wafer.

2. If the liquid immersion fluid leaks into the exposure tool and the coating tool and is left as it is, microorganisms such as bacteria are grown in the leaking solution, which increases the concentration of a chemical species such as a base in the air inside the exposure tool and coating tool. This leads to a decrease in productivity due to deterioration of lithographic performance, stops the tools and generates repair cost.

3. If drying is performed before post exposure bake (PEB) with the liquid immersion fluid remaining on the substrate surface or if the PEB step is implemented with the remaining liquid immersion fluid, watermarks are produced on the resist film. In a relevant part, there are caused non-resolution of the resist pattern, a T-topped shape and a size change. Defects are produced in a process pattern using this resist pattern as a mask. This results in a productivity decrease.

4. If the PEB is carried out with the liquid immersion fluid remaining on the substrate surface, the temperature of the resist film changes due to latent heat in the vicinity of the part where the liquid immersion fluid remains, and the size of the resist pattern changes. This results in a productivity decrease.

5. If the PEB is carried out with the liquid immersion fluid remaining on the substrate surface, the amount of a substance volatizing from the film on the substrate increases, or a substance is generated by a reaction between the volatilizing substance and the liquid immersion fluid. As a result, adherents on the inner wall of a baking unit in the PEB step increase, and the adherents act on a wafer as dust to cause a pattern defect, leading to a productivity decrease and a loss.

6. If the PEB is carried out with the liquid immersion fluid remaining on the substrate surface, a surface state change is caused in the resist film or a cover film in the vicinity of the part where the liquid immersion fluid remains. This causes the removal of the cover film, an insufficient removal of the cover film due to occurrence of parts of different development characteristics, or a loss from a productivity decrease due to occurrence of development defects.

Therefore, there has been a demand to realize a pattern forming method and a method of manufacturing a semiconductor device which can restrain the occurrence of the problems caused by the liquid immersion fluid used during the immersion lithography exposure.

BRIEF SUMMARY OF THE INVENTION

According to a first aspect of the invention, there is provided a method of pattern forming, which includes:

forming a resist film on a substrate;

coating the resist film with a coating solution which forms a cover film on the resist film to form the cover film on the resist film;

transferring a pattern onto the resist film by an immersion lithography method using a liquid immersion fluid to form a latent image on the resist film;

removing the cover film after the formation of the latent image;

conducting a first inspection to inspect whether or not the cover film has a defect between said forming the latent image and said removing the cover film;

performing predetermined processing when the defect is found in the first inspection; and developing the resist film to form a resist pattern on the substrate after said removing the cover film.

According to a second aspect of the invention, there is a method of pattern forming, which includes:

forming a resist film on a substrate;

transferring a pattern onto the resist film by an immersion lithography method using a liquid immersion fluid to form a latent image on the resist film;

conducting a first inspection to inspect whether or not the liquid immersion fluid remains on the resist film after said forming the latent image;

developing the resist film after the first inspection; and performing predetermined processing when residual of the liquid immersion fluid is found in the first inspection.

According to a third aspect of the invention, there is provided a method of manufacturing a semiconductor device, which includes:

forming a resist film on a semiconductor substrate;

transferring a semiconductor device pattern onto the resist film by an immersion lithography method using a liquid immersion fluid to form a latent image on the resist film;

conducting a first inspection to inspect whether or not the liquid immersion fluid remains on the resist film after the formation of the latent image;

implementing post exposure bake for the resist film after the first inspection; developing the resist film after the post exposure bake; and performing predetermined processing when residual of the liquid immersion fluid is found in the first inspection.

BRIEF DESCRIPTION OF THE SEVERAL VIEWS OF THE DRAWING

FIG. 1 shows a flowchart to explain a manufacturing process of a semiconductor device according to a first embodiment;

FIGS. 2A and 2B are schematic diagrams to explain rinsing in the first embodiment, wherein FIG. 2A is a plan view and FIG. 2B is a side view;

FIGS. 3A and 3B are schematic diagrams to explain another rinsing in the first embodiment, wherein FIG. 3A is a plan view and FIG. 3B is a side view;

FIGS. 4A and 4B are schematic diagrams to explain removal processing after rinsing in the first embodiment, wherein FIG. 4A is a plan view and FIG. 4B is a side view;

FIG. 6 is a plan view representing the arrangement of exposure fields formed on a wafer in the first embodiment;

FIG. 20 shows a flowchart to explain a manufacturing process of a semiconductor device according to [Modification 3-5] of the third embodiment.

DETAILED DESCRIPTION OF THE INVENTION

Figure 5:
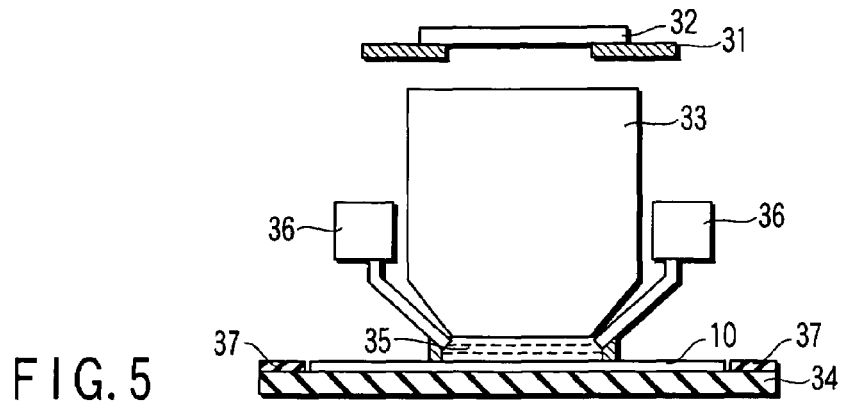
FIG. 5 is a schematic sectional view of an exposure tool according to the first embodiment.

According to embodiments of the present invention hereinafter described, a coating liquid film or a cover film is inspected to determine whether or not it is defective during a period after the formation of the coating liquid film for the formation of the cover film and before the removal of the cover film. If the film is defective, predetermined processing for implementing a predefined treatment is performed to enable the restraint of the elution of an inclusion from a resist film into a liquid immersion fluid.

Furthermore, after the formation of a latent image by immersion lithography, a first inspection is conducted to see whether a liquid immersion fluid remains on the resist film, such that problems caused by an optical path medium remaining on a substrate can be avoided. Alternatively, if adjustment of a tool, or rinsing or wafer reprocessing is implemented in early stages, it is possible to avoid the spread of the problems to next steps or subsequent lots. This improves production efficiency.

The embodiments of the present invention will hereinafter be described referring to the drawings.

First Embodiment

FIG. 1 shows a flowchart to explain a pattern forming method of a semiconductor device according to a first embodiment of the present invention.

First, a bottom-layer antireflection film is formed on a semiconductor substrate. In the present embodiment, for example, a coating-type bottom-layer antireflection film is formed (step ST101).

Then, a chemically amplified positive resist film is formed on the antireflection film (step ST102). In forming the resist film, the resist film at the edge of a wafer is selectively removed.

In a separately conducted surface analysis of some ArF chemically amplified resist films, it has been proved that photo-acid generators and acid trap agents (such as amine) are distributed on the film surface. In order to remove the photo-acid generators and the acid trap agents on the resist film surface, pure water is supplied to the resist for rinsing (step ST103). This rinsing removes the photo-acid generators and the acid trap agents on the resist film surface. It is to be noted that a cover film may be additionally formed on the resist film to eliminate the influence of the photo-acid generators and the acid trap agents remaining on the film surface after baking. The photo-acid generators and the acid trap agents can exist on the cover film depending on the heating state, and similar rinsing may be required.

FIGS. 2A and 2B are diagrams showing a state where the rinsing according to the first embodiment of the present invention is carried out. FIGS. 2A and 2B are a schematic plan view and side view of the state during a period the rinsing is carried out, respectively.

As shown in FIGS. 2A and 2B, a semiconductor substrate 10 is held on a substrate support part 11. The substrate support part 11 is rotated by a drive part 12. Pure water (third chemical agent) 14 which is a rinsing liquid is supplied from a rinsing nozzle 13 to the semiconductor substrate 10 while the semiconductor substrate is being rotated. In the rinsing, as shown in FIG. 2A, the rinsing nozzle 13 reciprocates between one end and the opposite end on the circumference of the substrate 10. The movement speed of the rinsing nozzle 13 is lower in a state where the rinsing nozzle 13 is located on the circumference of the substrate 10 than in a state where the rinsing nozzle 13 is located over the center of the substrate 10. As a result, the rinsing liquid supplied per unit area of the substrate 10 will be equal, and effects of rinsing can be enhanced. It is to be noted that when the nozzle 13 performs uniform motion, similar effects can be obtained if the rotation number of the substrate is changed in inverse proportion to a distance from the center of the substrate with respect to the nozzle position.

Furthermore, any chemical agent may be utilized as long as it can easily remove these substances, and it is not limited to the pure water described in the present embodiment. When the rinsing requires a long time, oxygen dissolved water, hydrogen dissolved water, carbonic acid dissolved water or the like can be used as the rinsing liquid to enable short-time processing. When the oxygen dissolved water is used, rinsing at 10 ppm or lower can cause no damage to the film surface. When the hydrogen water is used, it is preferably used substantially in a saturated state (about 1.2 ppm). The selection from these chemical agents is preferably carried out under a condition where the photo-acid generators and the acid trap agents are easily let free from the film surface, depending on a potential produced when the film surface is exposed to the chemical agent and on potentials in the solution of the photo-acid generators and the acid trap agents.

Moreover, as shown in FIGS. 3A and 3B, the nozzle 13 may be moved back and forth between the center of the substrate 10 and the one end on the circumference of the substrate 10. FIGS. 3A and 3B are diagrams showing a state where the rinsing is carried out in the first embodiment of the present invention. FIGS. 3A and 3B are a schematic plan view and side view, respectively, of the state while the rinsing is carried out. In FIGS. 3A and 3B, identical numbers are assigned to parts identical to those in FIGS. 2A and 2B, and the duplicated explanation of these parts are omitted.

In addition, water is injected to the main surface of the substrate 10 in a direction perpendicular to this main surface in the present embodiment, but the present invention is not limited thereto. For example, water may be injected in the same direction as the rotation direction of the substrate 10. In this way, the impact of the pure water 14 is reduced when it collides with the film surface, and rinsing can be achieved without damaging the film surface. Further, if the water is injected in a direction reverse to the rotation direction of the substrate, the photo-acid generators and the acid trap agents adhering to the film surface can be efficiently removed. Moreover, if the water is injected toward the circumference of the substrate, the photo-acid generators and the acid trap agents removed from the film surface can be efficiently ejected to the outside of the substrate.

Then, the resist film surface is dried (step ST104). For the drying, as shown in FIGS. 4A and 4B, a gas 22 from which an acid and alkali are filtered is blown to the main surface of the substrate 10 through an air knife 21. An area of the substrate onto which the air knife 21 blows air is only a part of the substrate surface. In order to blow air all over the surface of the substrate 10, the air knife 21 scans the surface of the substrate 10 from one end to the other end on the circumference of the substrate. In this case, the substrate 10 may be rotated or stationary.

FIGS. 4A and 4B are diagrams showing a state where the removal of the rinsing liquid according to the first embodiment of the present invention is carried out. FIGS. 4A and 4B are a plan view and side view, respectively, showing the state where the removal of the rinsing liquid is carried out. The pure water 14 may be removed to such a degree that adsorbed water remains on the film surface. The air 22 blown from the air knife 21 is desirably oriented in a moving direction of the air knife 21. Making directions same with respect to the blowing and moving can realize efficient and short-time removal of water. The point of the removal of the pure water 14 in this step lies in the fact that baking or drying under reduced pressure is not conducted. If the baking or drying under reduced pressure is conducted, the photo-acid generators and the acid trap agents are extracted from the inside of the resist film and again emerge on the film surface, thus losing the preceding rinsing effects. In the case of a substrate with a small diameter, the substrate may be rotated without using the air knife to accomplish drying.

Then, the resist film is coated with a coating solution by a spin coater to form a cover film thereon, thus forming an coating liquid film (step ST105). After the formation of the coating liquid film, the substrate is continuously rotated, and the coating solution is dried by spin drying, thereby forming a coated film (step ST106). The substrate is continuously rotated, and an etching solution is sprayed onto a rear surface of the wafer to remove the coated film clinging to the rear surface of the wafer (step ST107). During edge/back rinsing, the surface of the coated film is inspected for a coating defect (step ST108).

When the inspection is conducted during the rotation of the substrate, information in the rotation direction for each point of the radial direction of the substrate is averaged to detect a coating defect. Thus, it is possible to judge whether or not the coating defect exists. However, with respect to identification of the position of the coating defect, position determination accuracy in the circumference of the substrate slightly decreases because the movement speed thereof is higher even if the rotation is performed at a low speed.

The following techniques can be considered as detection methods, but are not limited thereto.

(A) Reflection of Detection Light

Detection light strikes on the substrate in a vertical or oblique direction, and the intensity or phase of the detection light is detected by a detector provided at a position conjugate with the detection light source. This detection is conducted by scanning substantially the entire area on the substrate. In this case, it is desirable to optimize a scanning interval in a detection area in accordance with the area of the detection light on the substrate (and a valid detector area of the detector). When there is a part where the detected light is out of a predetermined limit, the upper layer cover film is judged to have the coating defect. In this case, influence of a substrate edge portion and an underlying step of the substrate may be taken into consideration.

(B) Image Processing

An image of the upper portion of the substrate is obtained, and the image abnormality at the inspection position is judged. In accordance with a tint change or a template based on an original image or CAD information corresponding to a laminated structure and an inspection position of the substrate, an image abnormality at the inspection position is judged. When it is judged that an abnormality exists, this is recognized as the coating defect.

(C) Capacitance Meter

When the upper layer cover film is a dielectric, a capacitance meter is considered to be effective. The following two forms can be contrived.

The first one is a scanning form wherein a scan on the substrate is possible and a relative position of the coating defect of the upper layer cover film on the substrate can be detected.

The second one is a form wherein capacitance meters are disposed in a predetermined arrangement on a flat plate having an area larger than that of the substrate, and the capacitance meters are opposed to the exposed substrate, and the position of the coating defect of the upper layer cover film is read from the detected arrangement information with respect to the capacitance meters.

Then, the coated film is baked to remove a solvent remaining in the coated film (step ST109). A cover film is completed by the removal of the solvent.

Then, wafer edge exposure is conducted (step ST110). This wafer edge exposure is conducted to remove, in the course of the development, a slightly lifted rim portion during the selective removal of the edge portion of the resist film. Since the resist film is positive, it is removed during the development by exposing the wafer edge.

Then, the wafer is loaded to an immersion lithography scan and repeat type exposure tool (step ST111). It is then judged whether or not the loaded substrate has a coating defect in a coating inspection step (step ST112). A step and repeat type exposure tool can be used instead.

When there is no coating defect, various alignment adjustments are made, and then a pattern is transferred to form a latent image in the resist film (step ST113).

The exposure tool used in the present embodiment is a liquid immersion type. FIG. 5 schematically shows the exposure tool. FIG. 5 is a diagram showing a schematic configuration of the exposure tool according to one embodiment of the present invention. A reticle stage 31 is disposed under unshown illumination optics. A reticle 32 is disposed on the reticle stage 31. The reticle stage 31 is capable of translating. A projection lens system 33 is disposed under the reticle stage 31. A wafer stage 34 is disposed under the projection lens system 33. The semiconductor substrate 10 which has been subjected to the above-mentioned processing is disposed on the wafer stage 34. The wafer stage 34 translates together with the semiconductor substrate 10. A support plate 37 is provided on the periphery of the semiconductor substrate 10.

A liquid film 35 of the pure water (liquid immersion fluid) is formed under the projection lens system 33. A pair of water supply/drain devices 36 to supply and drain water is provided beside the projection lens system 33 to form the liquid film 35. During exposure, a space between the substrate 10 and the projection lens system 33 is filled with the liquid film 35 of water. Exposure light emitted from the projection lens system 33 passes through a layer of the liquid film 35 to reach an irradiation area. An image of a mask pattern (not shown) on the reticle 32 is projected on a photoresist on the substrate surface corresponding to the irradiation area, whereby a latent image is formed.

Figure 7A:
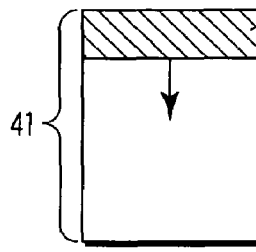
FIGS. 7A to 7C are schematic diagrams used to explain scan/exposure according to the first embodiment.
Figure 7B:
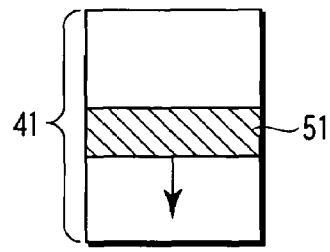
Figure 7C:
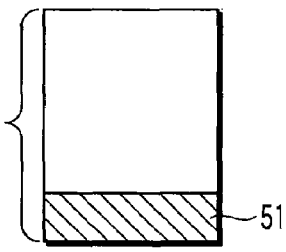
Figure 8A:
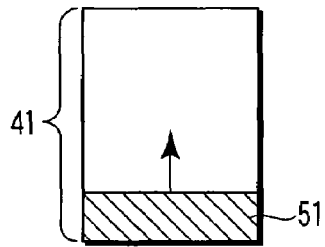
FIGS. 8A to 8C are schematic diagrams used to explain another scan/exposure according to the first embodiment.
Figure 8B:
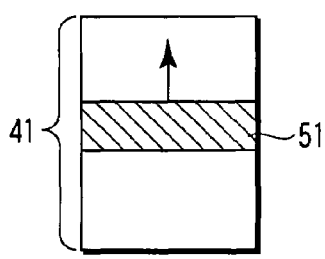
Figure 8C:
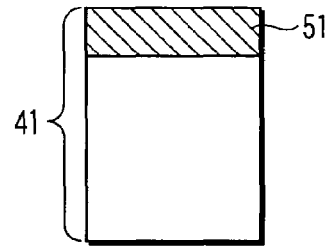

FIG. 6 is a plan view representing the arrangement of exposure fields formed on the wafer. A mask pattern drawn on one sheet of reticle is projected and transferred onto rectangular exposure fields 41 on the substrate 10 by scan-exposure. During the scan-exposure, for example, as shown in FIGS. 7A to 7C, an exposure slit area 51 scans the exposure field 41 from the upper side to lower side of the drawing. Alternatively, as shown in FIGS. 8A to 8C, the exposure slit area 51 scans the exposure field 41 from the lower side to upper side of the drawing. FIGS. 7A to 7C and 8A to 8C are diagrams used to explain the scan-exposure according to the first embodiment of the present invention.

Figure 9:
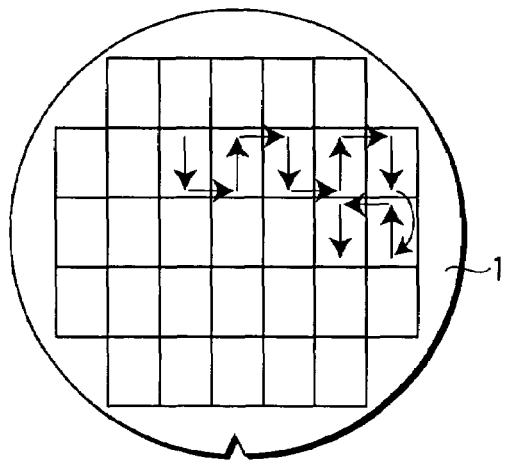
FIG. 9 is a plan view representing one example of an exposure sequence when the respective exposure fields are sequentially scanned/exposed.

FIG. 9 is a plan view representing one example of an exposure sequence when the respective exposure fields are sequentially scan-exposed. Upward arrows and downward arrows in FIG. 9 indicate directions in which the exposure slit area moves. As shown in FIG. 9, one exposure field is scan-exposed, and then the next exposure field is scanned/exposed in an opposite scanning direction. Such an operation is repeated to expose the entire surface of the substrate.

When it is judged in step ST112 that the coating defect is present, the substrate is put on standby in the exposure tool (step ST114). A standby time change may cause pattern dimension change, so that it is preferable this standby time is the same as the time required for the alignment and pattern transfer.

After the formation of the latent image or after the standby, the substrate is unloaded from the exposure tool (step ST115).

Figure 10:
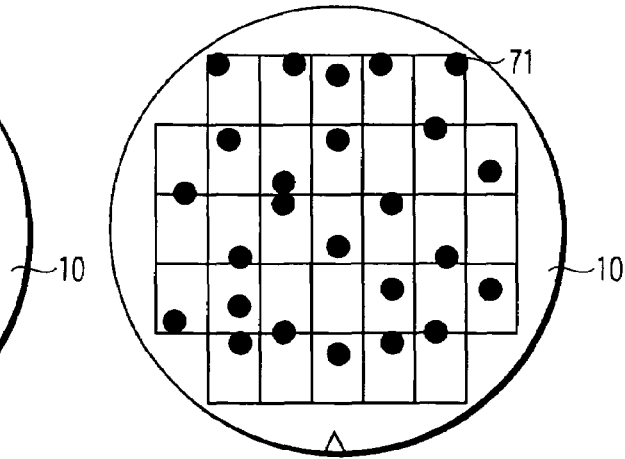
FIG. 10 is a plan view showing droplets remaining on a substrate after the scan/exposure according to the first embodiment.

During the scan-exposure, the water supply/drain units 36 collect water so that no water remains on the substrate. However, for example, when the cover film on the substrate easily repels water (the contact angle of the cover film with water is great), when the movement speed of the stage is high, or when an absolute value of acceleration/deceleration of the stage is high, residual water 71 is produced on the substrate 10, as shown in FIG. 10. If next baking (PEB) is implemented in a state where the water partly remains on the resist film after the exposure as above, an amount of heat supplied to the resist film is smaller in a part where the water remains and absorbs heat than in other parts. Thus, it is not possible to cause a sufficient reaction from the baking in the resist film, which leads to an abnormal line width. When the resist is a positive resist, unopened defects are produced. When the resist is a negative resist, there arises a problem of occurrence of defects having an opening trouble.

To solve these problems, it is desired in the present embodiment that the residual water 71 on the substrate be removed after the immersion lithography. Spin drying is often used to remove the residual water on the substrate 10. However, since the residual water 71 is dotted on the substrate 10, it is difficult to remove the residual water 71 by the spin drying.

In the present embodiment, the following processing is implemented to remove the residual water 71. That is, the substrate on which the latent image is formed is loaded to a water processing unit where residual water removal processing is carried out. To carry out the removal of the residual water, pure water is supplied to the entire surface of the substrate to form a liquid film substantially on the entire surface of the substrate (step ST116). The liquid film of the pure water is removed by use of the spin drying or the air knife, as in the drying after the rinsing in step ST103 (step ST117). In the above processing, water (the residual water and the liquid film) on the film surface is completely removed. If the water cannot be completely removed, it is possible to create a state in which water is similarly absorbed between exposure shots. When the water is similarly absorbed between exposure shots, a dimensional difference produced in subsequent baking is fed back in advance as a dimensional conversion difference to a mask used during exposure such that a desired resist pattern can finally be obtained. It is to be noted that water is used here, but this is not a limitation. It is also possible to use chemical agents such as alcohols and ethers which have a good affinity with water and which do not damage the resist film and whose vaporization heat is lower than that of droplets (water in this embodiment: vaporization heat=583 cal/g at 100° C.). Alternatively, it is possible to use these chemical agents dissolved in a solvent having the same components as those of the droplets. The chemical agent used will be better if it is quick-drying. The above processing is effective not only in the resist film surface but also in the cover film surface when the cover film is used.

The substrate which has been subjected to the processing described above is loaded into a baker where the substrate to be processed (resist film) is baked (PEB) (step ST118). An acid produced in the resist film at the stage of exposure is diffused and reacted with the protection-unit of resist polymer by the baking. Further, an exclusive solvent different from a developing solution is used to remove the cover film (step ST119). After the removal of the cover film, the substrate is loaded to a development unit where development is implemented to form a resist pattern (step ST120). It is to be noted that an alkali-soluble cover film which dissolves in a tetra-methylammoniumhydroxide (TMAH) may be used as the cover film. Note that the TMAH solution is used for the development of the resist. Therefore, there is no need for a step of removing the cover film by the exclusive solvent, and it is possible to continuously implement the steps of removing the cover film and developing the resist film by the TMAH solution.

Then, it is judged whether or not there is a coating defect to sort out the substrates depending on the existence of the coating defect in the coating inspection (step ST121). If there is no coating defect, the substrate is brought to an ordinary inspection step (step ST122). If there is a coating defect, the resist film is removed (step ST123). Then, the lithography steps (step ST102 to step ST120) are again implemented (rework).

However, atmosphere control needs to be performed in at least the steps ranging from an exposure unit to the baker unit through the post-exposure water processing unit. It has been found out that the concentration of a basic substance needs to be 10 ppb or lower to restrain the acid loss to such an extent that the formation of the resist pattern is not affected. In addition, experimental results have been obtained which indicate that processing time including loading time is desirably managed in a range of ±10%.

According to the present embodiment, water is supplied to the cover film after the immersion lithography and then the water is removed, so that the residual water on the cover film surface can be removed. As a result, the occurrence of defective pattern formation can be restrained.

It is to be noted that after the immersion lithography, the pure water supply (step ST116) and the pure water removal (step ST117) have been carried out to remove the residual water 71 dotted on the substrate. However, the air knife 21 which blows a gas from a slit-like nozzle to a part of the substrate may scan the substrate to remove the residual water 71, as in the drying in step ST103. Moreover, an air gun may scan the substrate instead of the air knife. The capacity to remove the residual water is higher when the air knife is used than when the air gun is used. Therefore, it is preferable to remove the residual water 71 by use of the air knife rather than the air gun.

It is to be noted that the deaerated pure water is used for the water disposed between the lens and the substrate to be processed during exposure in the present embodiment, but this is not a limitation. It is also possible to use a liquid to which ions, salt or minute particles uniformly dispersed in the liquid are added to increase a refractive index. When use is made of an exposure tool having a small absorption coefficient for the exposure light wave length and adapted to a particular refractive index, any liquid may be used as long as it has the particular refractive index and does not damage a lens system or the like

[Modification 1-1]

Figure 11:
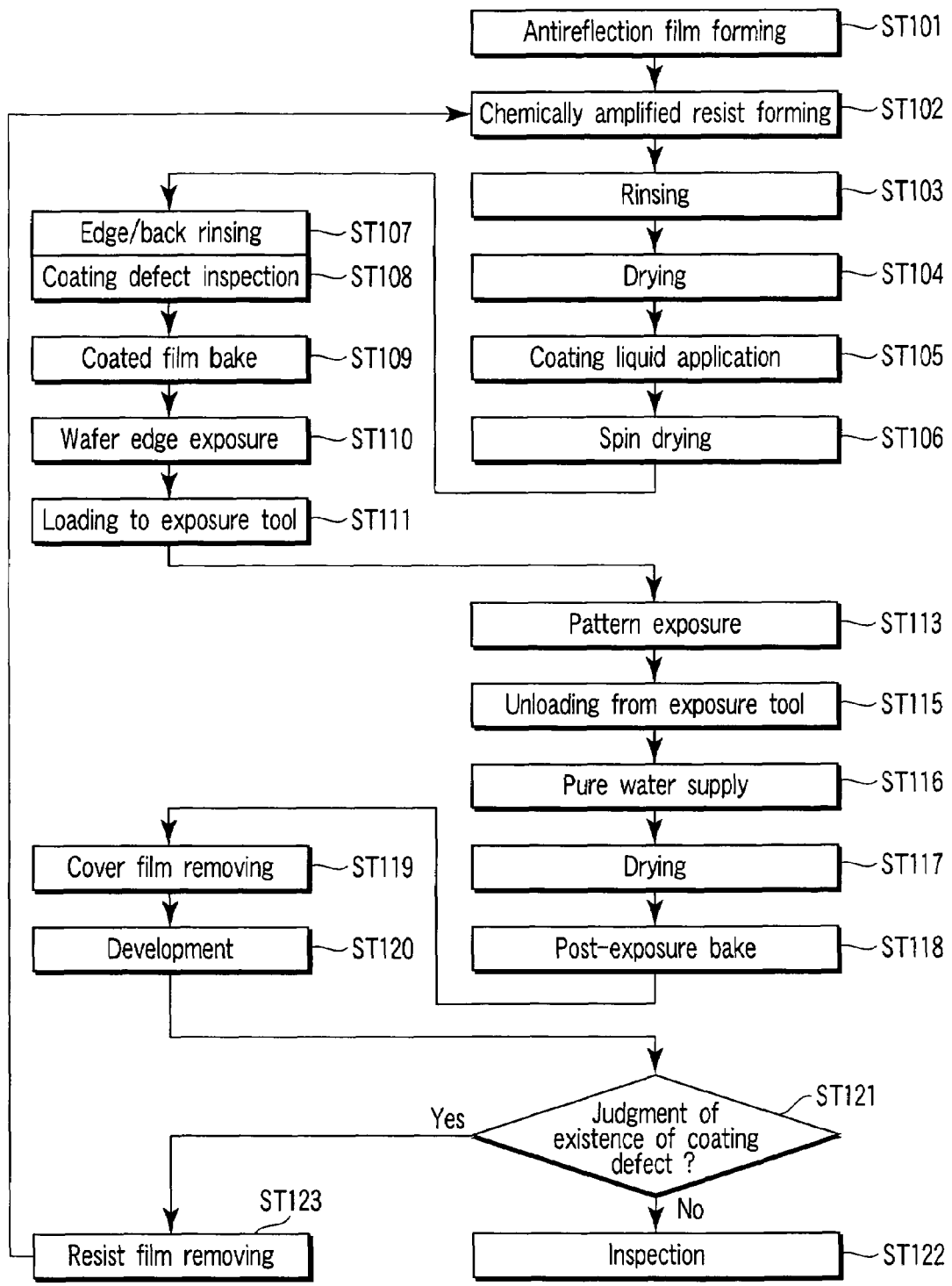
FIG. 11 shows a flowchart to explain a manufacturing process of a semiconductor device according to [Modification 1-1] of the first embodiment.

It is to be noted that in the embodiment described above, it is decided whether or not to transfer the semiconductor device pattern after the substrate is loaded to the exposure tool depending on the existence of the coating defect (step ST112). However, as shown in FIG. 11, the semiconductor device pattern may be transferred (step ST113) even if there is a coating defect without implementing the judgment processing in step ST112.

[Modification 1-2]

Figure 12:
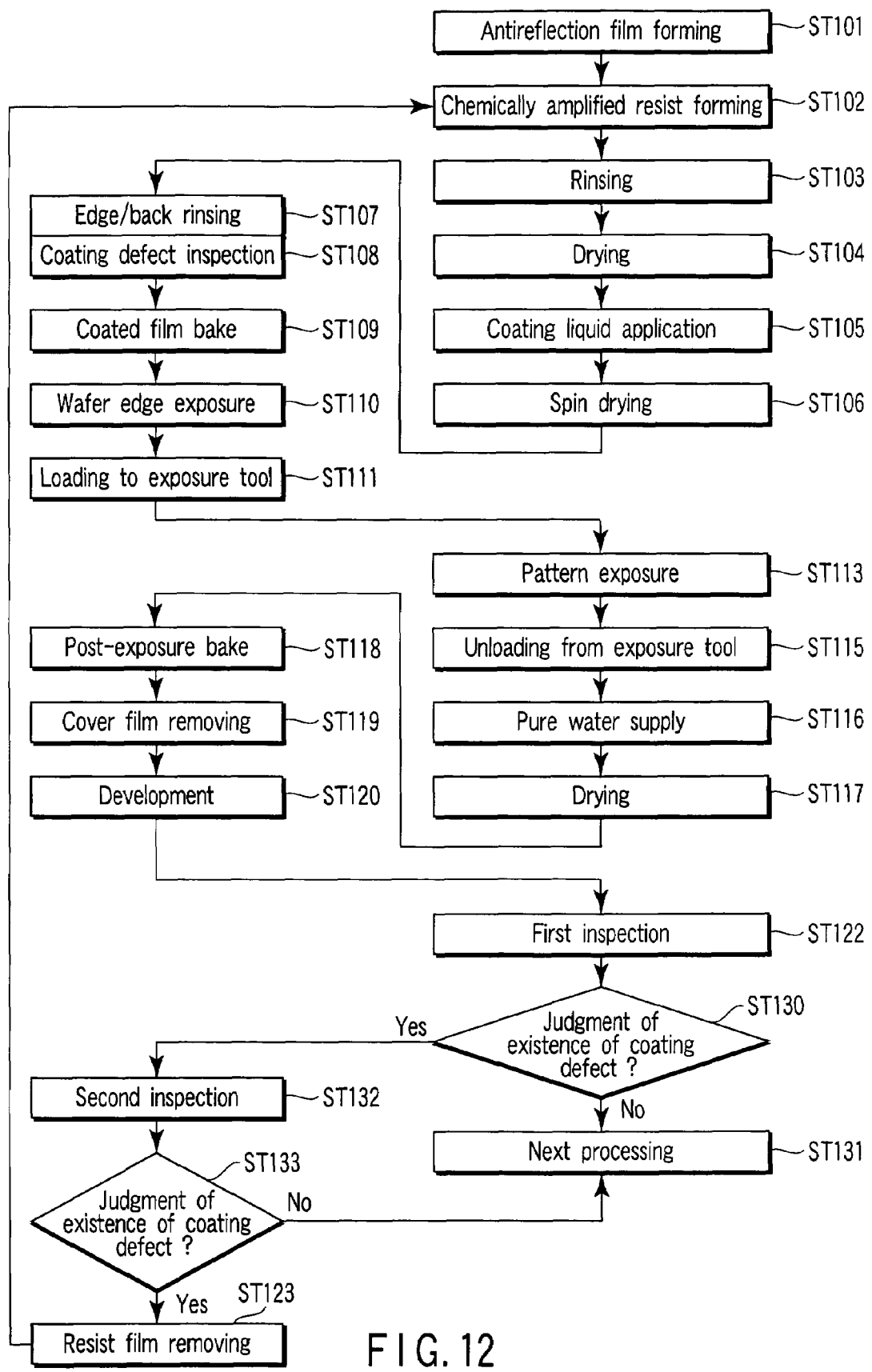
FIG. 12 shows a flowchart to explain a manufacturing process of a semiconductor device according to [Modification 1-2] of the first embodiment.

In addition, a flowchart of a modification of Modification 1-1 above (modification 1-2) is shown in FIG. 12. After the development (step ST120), an ordinary inspection (first inspection) is conducted (step ST122). A wafer which has passed the first inspection is judged as to whether it has a coating defect (step ST130). A wafer without a coating defect is brought to next processing (step ST131). A second inspection is conducted for a wafer with a coating defect (step ST133).

The kinds of second inspection include an optical defect inspection, dimensional measurement by a CD-SEM or the like, a macro inspection, and so forth. Items include non-resolution of a pattern due to the formation of watermarks which can be produced by the coating defect of a cover film, a change in water content, and a change in antireflection effects, a pattern formation defect such as T-top, and abnormal pattern dimensions, and so forth. Any inspection device other than the above-mentioned device may be used as long as it is capable of quantitative measurement of the dimensions, shape and the like of the pattern, or watermark detection.

It is to be noted that the second inspection may be conducted for the entire surface of the relevant wafer. In addition, during the inspection of the coating defect, information on the position of the coating defect may be stored, and the second inspection may be conducted for the position of the coating defect referring to the stored positional information.

Furthermore, in the second embodiment, it is considered whether or not a defect due to the detected coating defect of the cover film affects the operation of circuits, on the basis of pattern arrangement or design data with regard to a relevant layer and a shot map on the wafer during exposure. This consideration may be utilized to omit the second inspection or to judge results of the second inspection step.

It is to be noted that the second inspection may not only be conducted after the resist pattern formation but also be conducted, as required, for a pattern processed using the above-mentioned resist pattern as a mask.

It is judged whether or not an abnormality has been found in the second inspection (step ST133). A wafer without an abnormality is brought to next processing (step ST131). The resist film is removed from the wafer having an abnormality (step ST123), and rework is performed (step ST102 to step ST120).

A rework rate is lower in the case of [Modification 1-2] than in the case described in [Modification 1-1]. As a result, when costs and processing time are reduced in the above-mentioned additional inspection time as compared with the rework and repeated lithography processes, improvements are especially made in productivity and yield. Moreover, when heat resisting properties of an unprocessed layer or durability properties to the rework process are low, unnecessary rework can be reduced to improve the yield.

A mask pattern obtained in the manner as described above is transferred to a semiconductor wafer. Then, although not described in detail and not shown in the drawings, a semiconductor device can be manufactured through a well-known dicing step, mounting step, bonding step and packaging step.

Second Embodiment

In the present embodiment, an example will be described in which a coating defect inspection is conducted after a substrate is loaded to an exposure tool.

Figure 13:
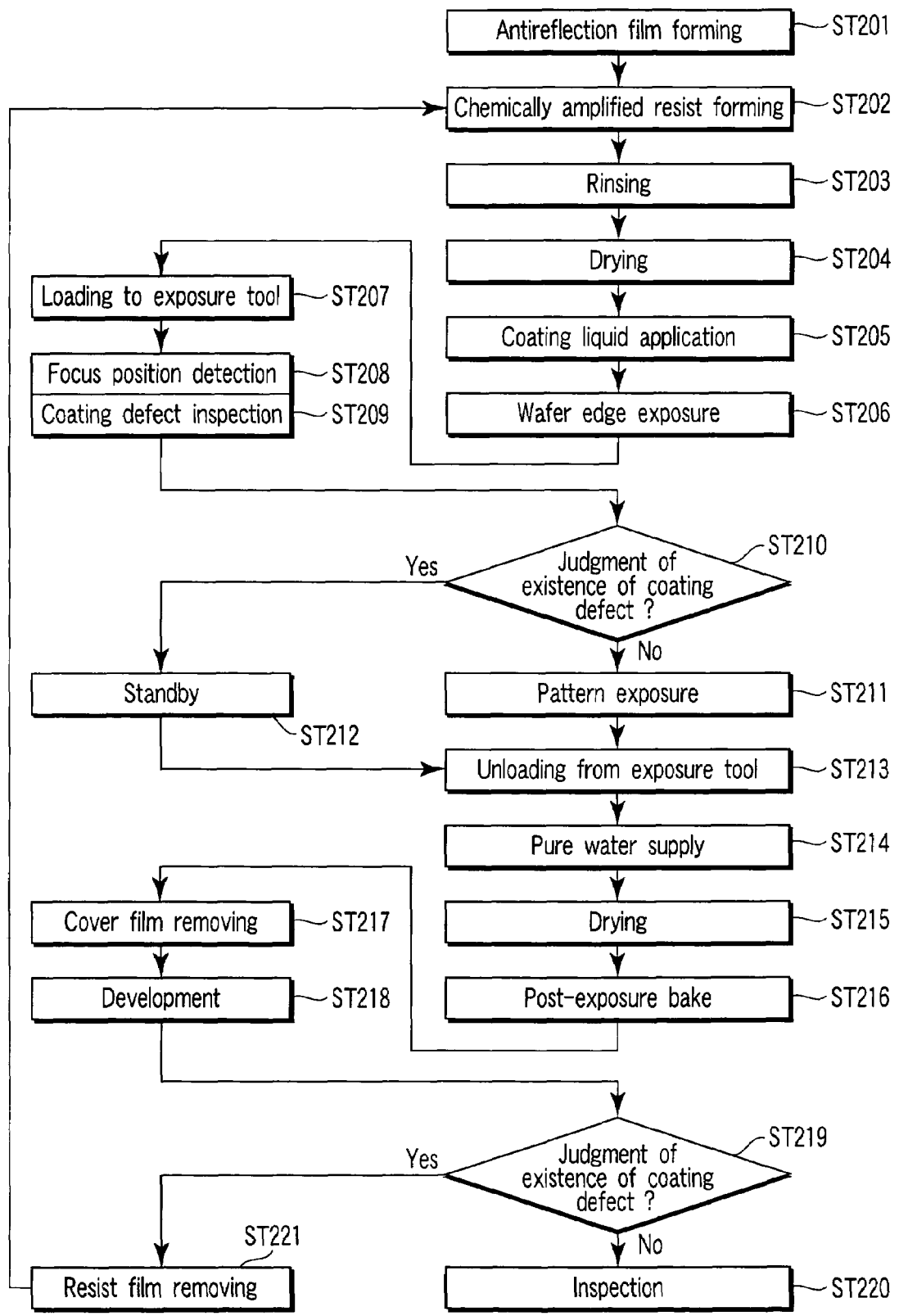
FIG. 13 shows a flowchart to explain a manufacturing process of a semiconductor device according to a second embodiment.

FIG. 13 is a flowchart to explain a method of forming a resist pattern according to the second embodiment of the present invention.

As in the first embodiment, processing from step ST201 to step ST206 is similar to that from step ST101 to step ST110 described in the first embodiment referring to FIG. 1, and therefore duplicated explanation is omitted.

Figure 14:
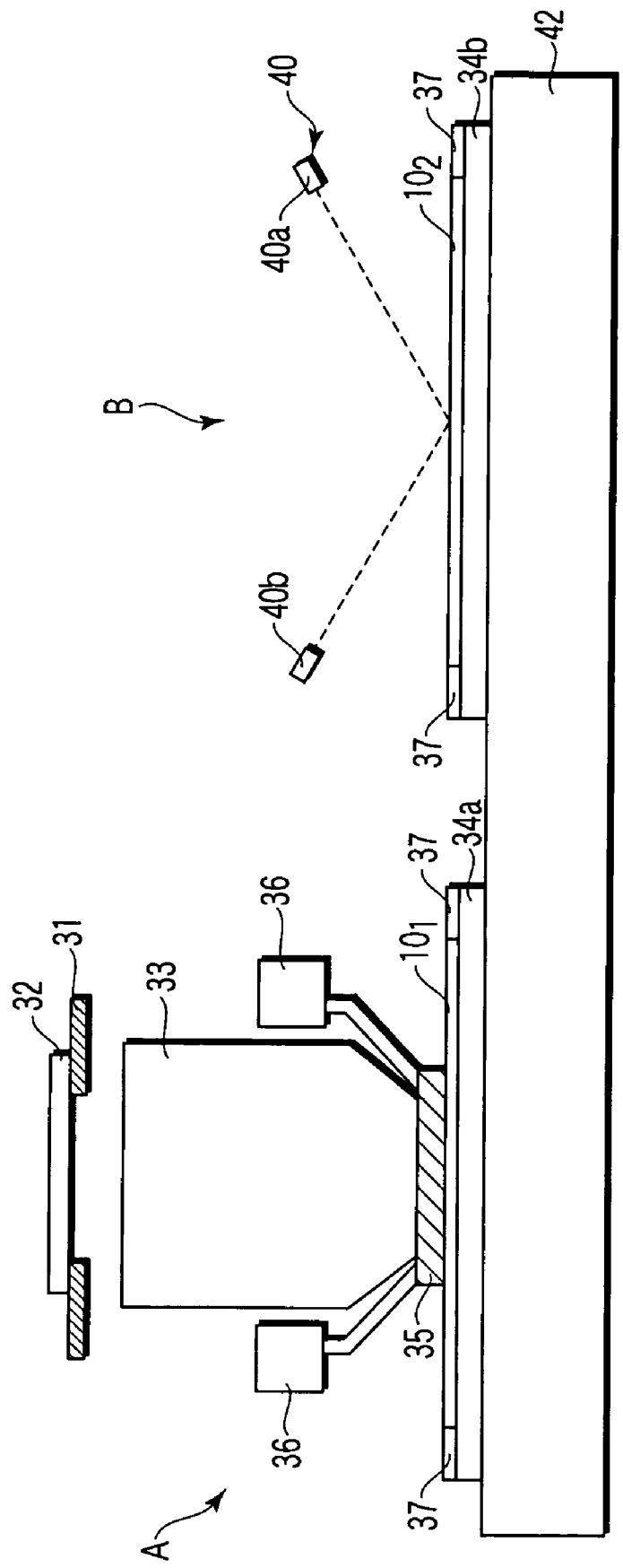
FIG. 14 is a schematic sectional view of an exposure tool according to the second embodiment.

Then, the substrate is loaded to the exposure tool (step ST207). In recent years, a twin-stage type exposure tool equipped with two stages to hold the substrate has appeared. The exposure tool used in the present embodiment is schematically described referring to FIG. 14. FIG. 14 is a diagram schematically showing the exposure tool according to the second embodiment of the present invention.

The twin-stage type exposure tool comprises first and second substrate stages 34a and 34b independently movable on a base 42. Moreover, the twin-stage type exposure tool has an exposure station A and a measurement/exchange station B. The measurement/exchange station B is equipped with a focus detection system 40 having a projection portion 40a and a light-receiving portion 40b.

In a basic operation of such a twin-stage type exposure tool, an exposed substrate 100 (not shown) and a substrate 102 on the second substrate stage 34b are exchanged and measured in the measurement/exchange station B, for example, during the exposure of the substrate on the first substrate stage 34a in the exposure station A. Then, when the respective operations have finished, the first substrate stage 34a moves to the measurement/exchange station B. In parallel with this, the second substrate stage 34b moves to the exposure station A. In turn, a substrate 101 and a next substrate 103 (not shown) are exchanged and the substrate 103 is measured in the first substrate stage 34a, and the substrate 102 on the second substrate stage 34b is exposed.

In other words, information on the surface position of a substrate 10 is detected by the focus detection system 40 in the measurement/exchange station B (step ST208), and this detection result is stored in a controller (not shown).

Furthermore, a detection signal of a focus detection system 40 is used to inspect the substrate for a coating defect (step ST209). The focus detection system 40 is disposed to detect a focus position in a scan direction of an exposure area. When scan directions exist in both directions, a switch is made to a coating defect detector disposed in the direction corresponding to a change in the scan direction, thus detecting a coating defect. This focus detection system is different from ordinary focus detection systems in the following point. In an ordinary scan-and-repeat focus detection system, the detectors have only to be disposed in the scan directions of the exposure area, that is, both directions of one axis on a substrate plane surface. On the other hand, in a coating defect detection device based on the present invention, movement between shots includes movement in a direction different from the scan directions of the exposure area, which is typically a direction perpendicular to the scan directions. Thus, it is also necessary to dispose a similar coating defect detection device in the perpendicular direction.

The controller moves the substrate from which the surface position information has been detected to the exposure station A. The substrate is judged as to whether it has a coating defect (step ST210). When the substrate has no coating defect, a semiconductor device pattern is transferred while a positional relation between an image surface of a projection lens system 33 and the surface of a substrate 10 are being adjusted on the basis of the stored surface position information (step ST211). When the substrate has a coating defect, it is put on standby (step ST212).

Processing from step ST213 to step ST221 that follow is similar to that from step ST115 to step ST123 described in the first embodiment referring to FIG. 1, and therefore duplicated explanation is omitted.

[Modification 2-1]

It is to be noted that in the embodiment described above, it is decided whether or not to transfer a semiconductor device pattern after the substrate is loaded to the exposure tool depending on the existence of the coating defect (step ST210). However, as in [Modification 1-1] of the first embodiment, the semiconductor device pattern may be transferred (step ST211) even if there is a coating defect without implementing the judgment processing in step ST210.

[Modification 2-2]

In addition, processing similar to that in [Modification 1-2] of the first embodiment may be performed. After the development, a first inspection is conducted. A wafer which has passed the first inspection is judged as to whether it has a coating defect. A wafer without a coating defect is brought to next processing. A second inspection is conducted for a wafer having a coating defect. It is judged whether or not an abnormality has been found in the second inspection. A wafer without an abnormality is brought to next processing. The resist film is removed from the wafer with an abnormality, and rework is performed.

In the present embodiment as well, a mask pattern obtained in the manner as described above is transferred to a semiconductor wafer. Then, although not described in detail and not shown in the drawings, a semiconductor device can be manufactured through a well-known dicing step, mounting step, bonding step and packaging step.

Third Embodiment

Figure 15:
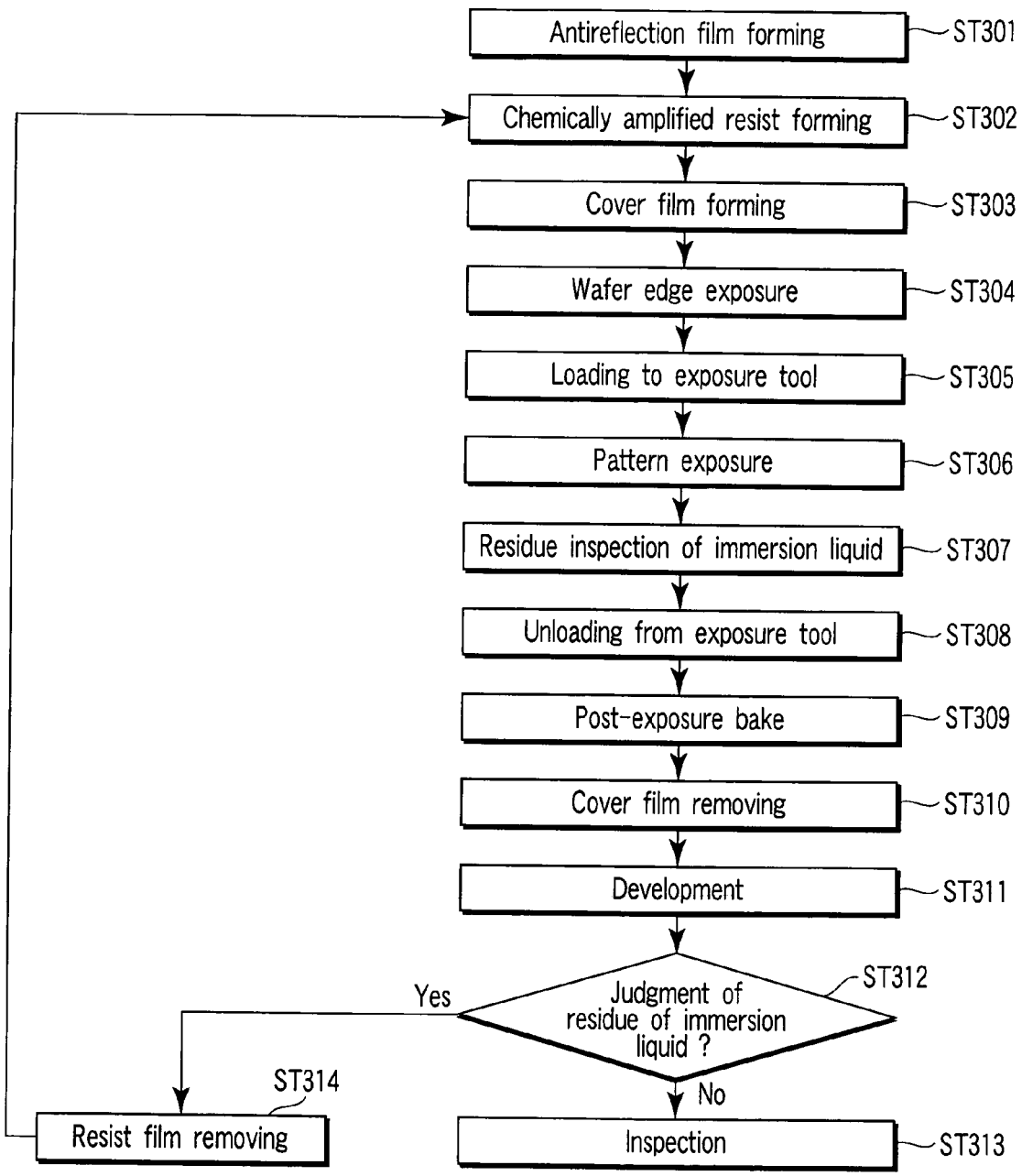
FIG. 15 shows a flowchart to explain a manufacturing process of a semiconductor device according to a third embodiment.

FIG. 15 is a flowchart to explain a manufacturing process of a semiconductor device according to a third embodiment of the present invention.

First, an antireflection film is formed on a semiconductor substrate. In the present embodiment, for example, a coating-type antireflection film is formed (step ST301). Then, a chemically amplified positive resist film is formed on the antireflection film (step ST302). A cover film is formed on the resist film (step ST303). Wafer edge exposure is conducted (step ST304). The wafer is loaded to an immersion lithography scan and repeat type exposure tool (step ST305). After various alignments are made, a semiconductor device pattern is transferred by immersion lithography to form a latent image in the resist film (step ST306).

Then, an inspection is conducted to know whether or not a liquid immersion fluid used during the immersion lithography remains on the cover film (step ST307). As detection mechanisms of the residual liquid immersion fluid, methods mentioned below are conceivable. A plurality of methods may be used together at the same time. Moreover, since the effects of the present invention are not changed depending on the detection method, any other method not mentioned below may be used. It is to be noted that the method which performs optical detection needs to use a wavelength at which the resist is not exposed.

(A) Reflection of Detection Light

Detection light strikes the substrate in a vertical or oblique direction, and the intensity or phase of the detection light is detected by a detector provided at a conjugate position. This detection is conducted by scanning substantially the entire area on the substrate. In this case, it is desirable to optimize a scanning interval in a detection area in accordance with the area of the detection light on the substrate (and a valid detector area of the detector). When there is a part having an unacceptable change of the detection light, it is judged that the liquid immersion fluid remains. In this case, influence of a substrate edge portion and an underlying step of the substrate may be taken into consideration. Moreover, a focus detection system installed in the exposure tool may be utilized.

(B) Incidence of Detection Light

A detection light source and a detector are provided in a direction substantially parallel with the substrate surface, and the intensity or phase of the detection light is monitored. When there is a part having an unacceptable change of the detection light, it is judged that the liquid immersion fluid remains.

(C) Utilization of Characteristic Absorption or Light Emission of Liquid Immersion Fluid Detection light strikes the substrate in a vertical or oblique direction, and the characteristic absorption or light emission of the liquid immersion fluid in reflected light is detected. There is a possibility that the liquid immersion fluid is adsorbed onto or immersed into the resist or the cover film. Thus, it is judged that the liquid immersion fluid remains in a part having a predetermined intensity or more of characteristic absorption or light emission.

(D) Image Processing

An image of the upper portion of the substrate is obtained. In accordance with a tint change or a template based on an original image or CAD information corresponding to a laminated structure and an inspection position of the substrate, an image abnormality at the inspection position is judged. When it is judged that the abnormality exists, this is recognized that the liquid immersion fluid remains.

(E) Capacitance Meter

Two kinds of forms can be devised.

The first one is a scanning form wherein a scan on the substrate is possible and a relative position of the residual liquid immersion fluid on the substrate can be detected.

The second one is a form wherein the capacitance meters are disposed in a predetermined arrangement on a flat plate having an area larger than that of the substrate, and the capacitance meters are opposed to the exposed substrate, and the position of the residual liquid immersion fluid is read from the detected information of the capacitance meter arrangement. Specifically, the flat plate is disposed above the exposed substrate for a time that allows the detection of the liquid immersion fluid. The capacitance meters are dispose under the flat plate, and a predetermined distance is maintained between the flat plate and the exposed substrate, such that the residual of the liquid immersion fluid can be detected by the capacitance meters. The capacitance meters may be provided on the top of a wafer handling arm to transfer the exposed substrate from the wafer stage.

After the inspection in step ST307, the wafer is unloaded from the exposure tool (step ST308). The wafer is loaded to a baker where the substrate to be processed (resist film) is baked (post exposure bake, PEB) (step ST309). An acid produced in the resist film at the stage of exposure is diffused and reacted with the protection-unit of resist polymer by the baking. Further, an exclusive solvent different from a developing solution is used to remove the cover film (step ST310). After the removal of the cover film, the substrate is loaded to a development unit where development is implemented to form a resist pattern (step ST311). It is to be noted that an alkali-dissoluble protection film, which dissolves in a TMAH solution used for the developing of the resist film, may be used as the cover film. In this case, there is no need for a step of removing the cover film by the exclusive solvent, and it is possible to continuously implement the steps of removing the cover film and developing the resist film by the TMAH solution.

Then, it is judged whether or not the liquid immersion fluid remains to sort out the substrates depending on whether or not the liquid immersion fluid remains in the inspection in step ST307 (step ST312). If there is no coating defect, the substrate is subjected to an ordinary inspection (step ST313). If there is a coating defect, the resist film is removed (step ST314), and then, the lithography steps (step ST302 to step ST311) are again implemented (rework).

According to the present invention, it is possible to avoid problems caused by the liquid immersion fluid. This improves production efficiency. In the immersion lithography, the liquid immersion fluid remains on the substrate and the liquid immersion fluid dries, with the result that so-called watermarks are produced, which leads to an abnormal resist shape or a pattern defect such as non-resolution of a pattern.

[Modification 3-1]

Figure 16:
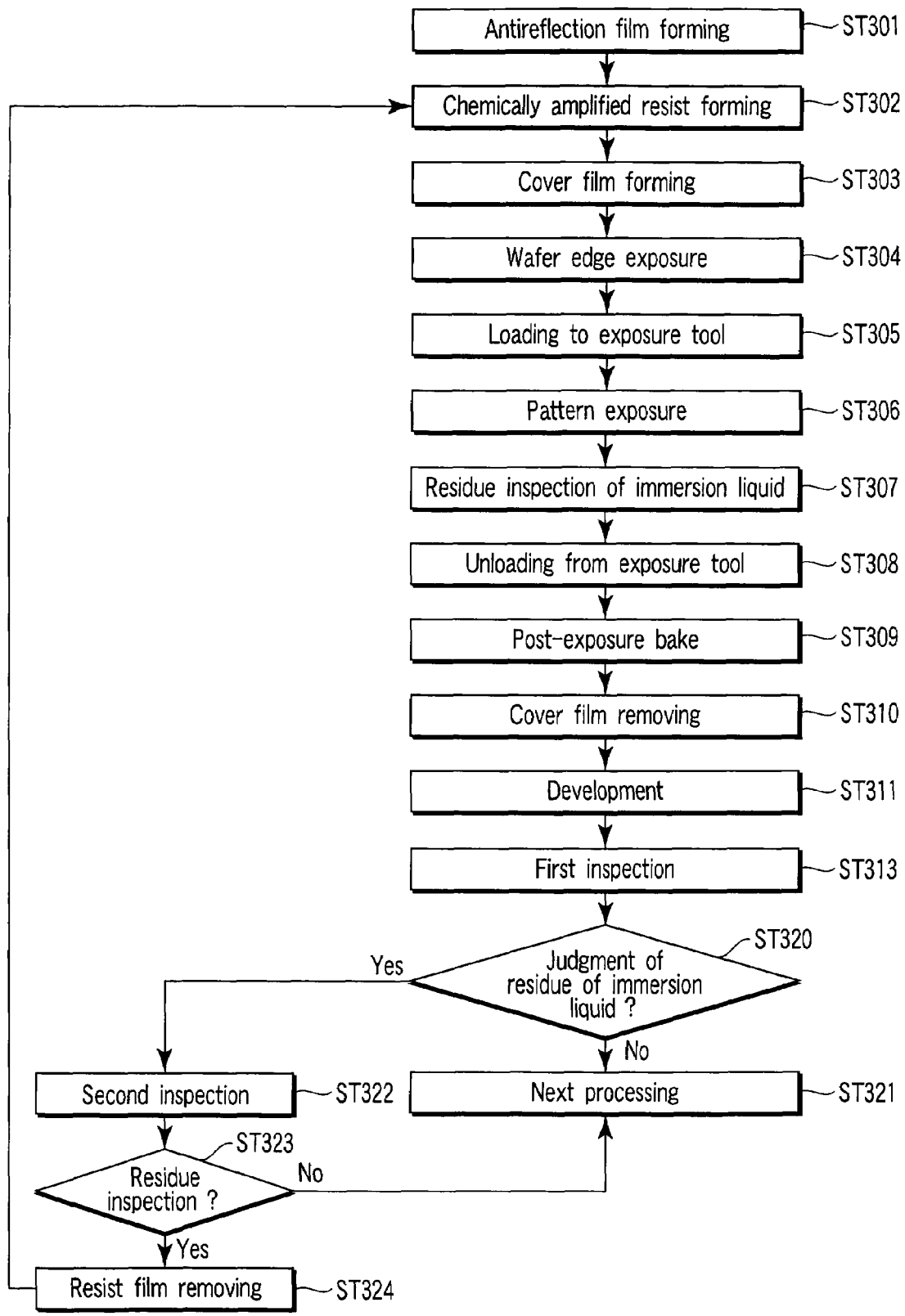
FIG. 16 shows a flowchart to explain a manufacturing process of a semiconductor device according to [Modification 3-1] of the third embodiment.

It is to be noted that processing may also be performed in accordance with a flowchart shown in FIG. 16. That is, after the development (step ST311), an ordinary inspection (first inspection) is conducted. A wafer which has passed the inspection is judged as to whether it has the residual of the liquid immersion fluid (step ST320). A wafer without any residual liquid is brought to next processing (step ST321).

A second inspection is conducted for a wafer with the residual liquid immersion fluid (step ST133). The kinds of second inspection include an optical defect inspection, dimensional measurement by a CD-SEM or the like, a macro inspection, and so forth. Items include non-resolution of a pattern due to the formation of watermarks which can be produced by the residual liquid immersion fluid, a change in water content, a change in antireflection effects, a pattern formation defect such as T-top, abnormal pattern dimensions, and so forth. Any device other than the above-mentioned device may be used as long as it is capable of quantitative measurement of the dimensions, shape and the like of the pattern, or watermark detection.

It is to be noted that the second inspection may be conducted for the entire surface of the relevant wafer. In addition, during the inspection of the residual liquid immersion fluid, information on the position of the residual liquid may be stored, and the second inspection may be conducted for the position of the residual liquid referring to the stored positional information.

Furthermore, in the implementation of the second inspection, it may be considered whether or not a defect due to the detected residual of the cover film affects the operation of circuits, on the basis of pattern arrangement or design data with regard to a relevant layer and a shot map on the wafer during exposure. This consideration may be utilized to omit the second inspection or to judge results of the second inspection step.

It is to be noted that the second inspection may not only be conducted after the resist pattern formation but also be conducted, as required, for a pattern processed using the above-mentioned resist pattern as a mask.

It is judged whether or not an abnormality has been found in the second inspection (step ST323). A wafer without an abnormality is brought to next processing (step ST321). The resist film is removed from the wafer having an abnormality (step ST324), and rework is performed (step ST302 to step ST313).

A rework rate is decreased in this manner. As a result, when costs and processing time are reduced in the above-mentioned additional inspection time as compared with the rework and repeated lithography processes, improvements are especially made in productivity and yield. Moreover, when heat resisting properties or durability properties to the rework process of an unprocessed layer is low, unnecessary rework can be reduced to improve the yield.

[Modification 3-2]

Figure 17:
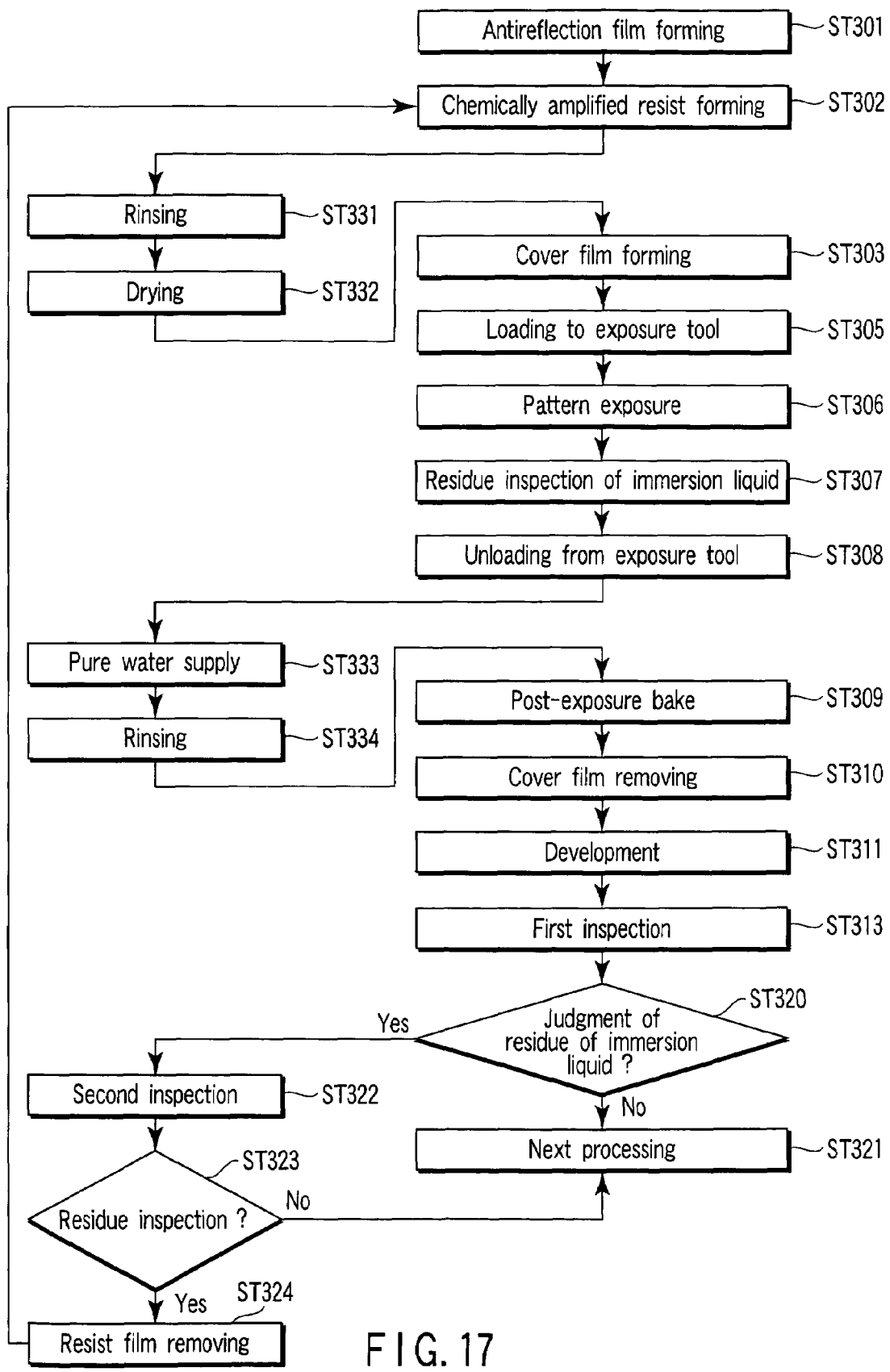
FIG. 17 shows a flowchart to explain a manufacturing process of a semiconductor device according to [Modification 3-2] of the third embodiment.

In addition, processing may also be performed in accordance with a flowchart of in FIG. 17. That is, rinsing (step ST331) and drying (step ST332) are performed which are similar to steps ST103 and ST104 described referring to a flowchart shown in FIG. 1 in the first embodiment. Moreover, pure water supply (step ST333) and drying (step ST334) are performed which are similar to steps ST116 and ST117 described referring to the flowchart shown in FIG. 1 in the first embodiment. It is to be noted that any one pair of processing of steps ST331 and ST332 and steps ST333 and ST334 may be performed.

[Modification 3-3]

Figure 18:
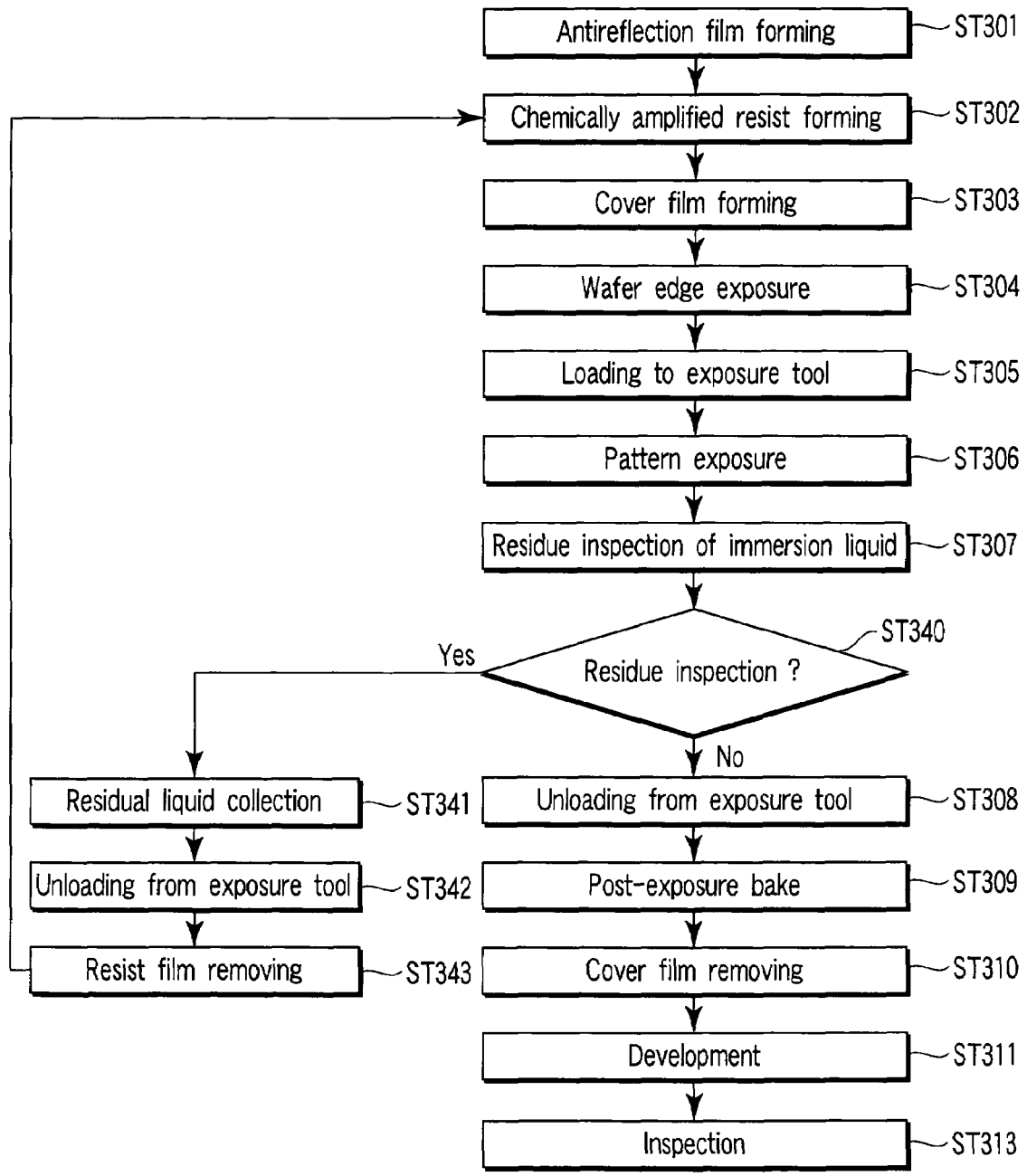
FIG. 18 shows a flowchart to explain a manufacturing process of a semiconductor device according to [Modification 3-3] of the third embodiment.

In addition, processing may also be performed in accordance with a flowchart shown in FIG. 18. After the inspection of the residual liquid immersion fluid (step ST307), it is judged whether the liquid immersion fluid remains (step ST340). If no liquid remains, the wafer is unloaded from the exposure tool (step ST308). Then, processing of steps ST310 to 311 and ST313 is sequentially performed. If the fluid remains, the residual liquid on the cover film in the exposure tool is collected (step ST341). The residual liquid is preferably collected by suction. The collection by suction makes it possible to prevent the residual liquid from scattering in the exposure tool. After the collection of the residual liquid, the wafer is unloaded from the exposure tool (step ST342). The resist film is removed (step ST343). Then, the lithography steps are again implemented (rework).

[Modification 3-4]

Figure 19:
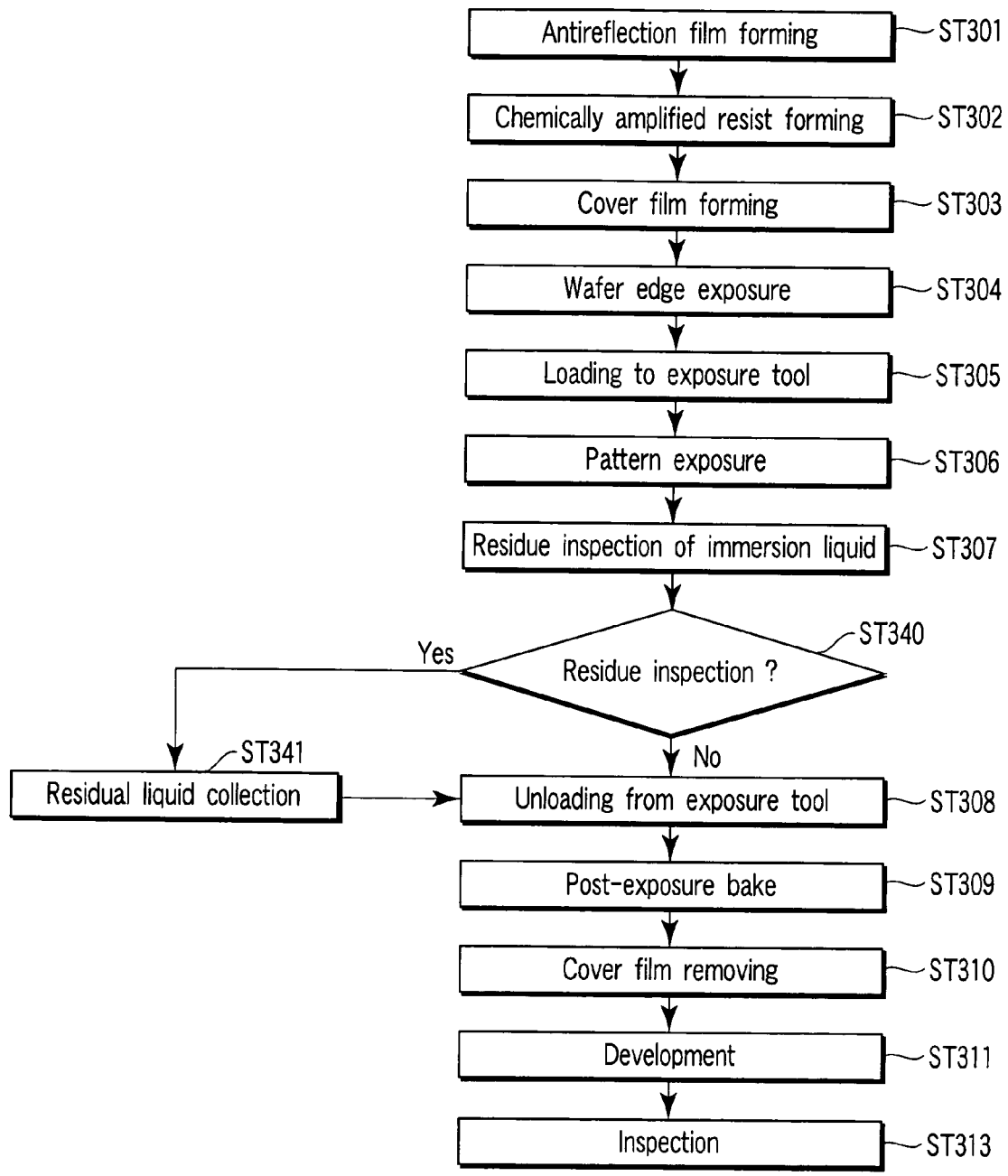
FIG. 19 shows a flowchart to explain a manufacturing process of a semiconductor device according to [Modification 3-4] of the third embodiment.

It is to be noted that after the collection of the residual liquid, processing similar to that for the case where no liquid remains may be performed, as shown in FIG. 19.

[Modification 3-5]

Furthermore, as shown in FIG. 20, it may be judged whether the liquid remains (step ST350) after the wafer is unloaded from the exposure tool. For the wafer having the residual liquid, processing (steps ST309 to 311 and ST313) similar to that for the wafer without any residual liquid is performed after the collection of the residual liquid (step ST351).

A mask pattern obtained in the manner as described above is transferred to a semiconductor wafer. Then, although not described in detail and not shown in the drawings, a semiconductor device can be manufactured through a well-known dicing step, mounting step, bonding step and packaging step.

It is to be noted that the present invention is not limited to the embodiments described above. For example, pure water having a refractive index of about 1.44 has been used as the liquid immersion fluid, but a liquid immersion fluid with a higher refractive index may be used to increase the resolution of the exposure tool. Specifically, salt, ions and surfactant may be added to the pure water. Moreover, an organic solvent, fluorine oil or the like may be used as the liquid immersion fluid.

A proper amount of edge cutting may be set for the bottom-layer antireflection film and the resist film in accordance with a loading system in a substrate processing step or with the convenience of the tool.

In addition, when the bottom-layer antireflection film includes a material eluting into the liquid immersion fluid, such as an acid or a photo-acid generator, a base or a surfactant, it is desirable to form a cover film to cover the bottom-layer antireflection film located on the substrate flat surface which can contact the liquid immersion fluid in at least the immersion lithography exposure tool.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of pattern forming comprising:
   forming a resist film on a substrate;
   coating the resist film with a coating solution which forms a cover film on the resist film to form the cover film on the resist film;
   transferring a pattern onto the resist film by an immersion lithography method using a liquid immersion fluid to form a latent image on the resist film;
   removing the cover film after the formation of the latent image;
   conducting a first inspection to inspect whether or not the cover film has a defect between forming the latent image and removing the cover film;
   performing predetermined processing when the defect is found in the first inspection; and
   developing the resist film to form a resist pattern on the substrate after removing the cover film.

2. The method according to claim 1, wherein forming the cover film includes baking the coating solution after said coating the resist film with a coating solution.

3. The method according to claim 1, wherein the first inspection is conducted between forming the cover film and forming the latent image; and
   the predetermined processing includes:
   putting the substrate on standby without forming the latent image on the resist film;
   removing the cover film after the standby;
   developing the resist film after removing the cover film; and removing the resist film after developing, to return to forming the resist film on the substrate.

4. The method according to claim 1, wherein the first inspection is conducted between forming the cover film and removing the cover film;
- a predetermined second inspection corresponding to a defective case is conducted for a substrate having the defect after developing; and
- the resist film is removed from the substrate which is judged to be defective in the second inspection, and the substrate is returned to forming a resist film on a substrate.

5. The method according to claim 4, wherein
- positional information of the defect is obtained in the first inspection; and
- the second inspection is conducted in accordance with the positional information.

6. The method according to claim 1, further comprising implementing post exposure bake for the resist film during a period after forming the latent image on the resist film and before removing the cover film.

* * * * *